United States Patent
Co et al.

(10) Patent No.: US 7,509,532 B2
(45) Date of Patent: Mar. 24, 2009

(54) ROBOTIC MEMORY-MODULE TESTER USING ADAPTER CARDS FOR VERTICALLY MOUNTING PC MOTHERBOARDS

(75) Inventors: Ramon S. Co, Trabuco Canyon, CA (US); Tat Leung Lai, Torrance, CA (US); David Da-Wei Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 702 days.

(21) Appl. No.: 10/249,841

(22) Filed: May 12, 2003

(65) Prior Publication Data
US 2004/0078698 A1 Apr. 22, 2004

Related U.S. Application Data

(63) Continuation-in-part of application No. 09/683,525, filed on Jan. 14, 2002, now Pat. No. 6,742,144, which is a continuation-in-part of application No. 09/702,017, filed on Oct. 30, 2000, now Pat. No. 6,357,023, and a continuation-in-part of application No. 09/660,714, filed on Sep. 13, 2000, now Pat. No. 6,415,397.

(51) Int. Cl.
*G06F 11/00* (2006.01)
(52) U.S. Cl. .............................. 714/25; 714/27; 714/29; 714/42
(58) Field of Classification Search ............... 714/25, 714/27, 29, 42, 24, 37, 39, 41, 47, 48; 711/104
See application file for complete search history.

(56) References Cited

U.S. PATENT DOCUMENTS

| | | | |
|---|---|---|---|
| 4,869,676 A | 9/1989 | Demler et al. ................ 439/79 |
| 5,403,208 A | 4/1995 | Felcman et al. ............. 439/633 |
| 5,577,205 A | 11/1996 | Hwang et al. ............... 361/683 |
| 5,794,175 A * | 8/1998 | Conner ........................ 714/25 |
| 5,815,377 A | 9/1998 | Lund et al. .................. 361/802 |
| 5,944,541 A | 8/1999 | Payne ......................... 439/108 |
| 6,040,691 A * | 3/2000 | Hanners et al. ............. 324/754 |
| 6,046,421 A | 4/2000 | Ho ............................. 209/573 |
| 6,088,224 A | 7/2000 | Gallagher et al. ........... 361/695 |
| 6,172,895 B1 * | 1/2001 | Brown et al. .................. 365/63 |
| 6,178,526 B1 * | 1/2001 | Nguyen et al. ................ 714/42 |
| 6,351,827 B1 | 2/2002 | Co et al. ....................... 714/42 |
| 6,356,094 B1 * | 3/2002 | Tverdy et al. ............... 324/758 |
| 6,357,023 B1 | 3/2002 | Co et al. ....................... 714/42 |
| 6,363,450 B1 | 3/2002 | Lash et al. .................. 710/301 |
| 6,415,397 B1 | 7/2002 | Co et al. ....................... 714/42 |

(Continued)

*Primary Examiner*—Robert Beausoliel
*Assistant Examiner*—Joseph D Manoskey
(74) *Attorney, Agent, or Firm*—Stuart T. Auvinen; gPatent LLC

(57) ABSTRACT

A test system for testing memory modules uses vertically-mounted personal computer (PC) motherboards. Many test adaptor boards that contain test sockets for testing memory modules are mounted horizontally across a test bench. Each test adaptor board connects to a motherboard that tests the memory modules in the test sockets. The motherboard is mounted below and perpendicularly to the test adaptor board. The motherboard is modified to extend the memory bus to edge contact pads along an edge of the motherboard. An edge socket on the test adaptor board mates with the edge contact pads to make electrical connection. A robotic arm inserts a memory module into the test socket, allowing the vertically-mounted motherboard to execute programs to test the memory module.

20 Claims, 8 Drawing Sheets

U.S. PATENT DOCUMENTS

| | | | |
|---|---|---|---|
| 6,721,195 B2 * | 4/2004 | Brunelle et al. | 365/63 |
| 6,788,081 B2 * | 9/2004 | Brunelle et al. | 324/755 |
| 7,165,002 B2 * | 1/2007 | Adler | 702/117 |
| 2002/0125879 A1 * | 9/2002 | Lee et al. | 324/158.1 |
| 2003/0011391 A1 | 1/2003 | Brunelle et al. | 324/755 |
| 2003/0049948 A1 * | 3/2003 | Kim et al. | 439/61 |
| 2005/0193274 A1 * | 9/2005 | Aoki et al. | 714/42 |
| 2006/0242468 A1 * | 10/2006 | Kang | 714/42 |

* cited by examiner

ROBOTIC MEMORY-MODULE TESTER USING ADAPTER CARDS FOR VERTICALLY MOUNTING PC MOTHERBOARDS

CROSS REFERENCE TO RELATED APPLICATIONS

This application is a continuation-in-part (CIP) of the application for "Local Heating of Memory Modules Tested on a Multi-Motherboard -Tester", U.S. Ser. No. 09/683,525, filed Jan. 14, 2002, now U.S. Pat. No. 6,742,144, which is a CIP of "Automated Multi-PC-Motherboard Memory-Module Test System with Robotic Handler and In-Transit Visual Inspection", U.S. Ser. No. 09/660,714, filed Sep. 13, 2000, now U.S. Pat. No. 6,415,397, and "Connector Assembly for Testing Memory Modules from the Solder-Side of a PC Motherboard with Forced Hot Air", U.S. Ser. No. 09/702,017, filed Oct. 30, 2000, now U.S. Pat. No. 6,357,023.

BACKGROUND OF INVENTION

This invention relates to test systems, and more particularly to PC-motherboard-based memory-module testers.

Electronic systems such as personal computers (PCs) use DRAM memory chips mounted on small, removable memory modules. Older single-inline memory modules (SIMMs) have been replaced with dual-inline memory modules (DIMMs), 184-pin RIMMs (Rambus inline memory modules) and 184-pin DDR (double data rate) DIMMs. New kinds of memory modules continue to be introduced.

The memory-module industry is quite cost sensitive. Testing costs are significant, especially for higher-density modules. Specialized, high-speed electronic test equipment is expensive, and the greater number of memory cells on high-speed memory modules increases the time spent on the tester, increasing test costs.

Rather than use an expensive general-purpose I.C. tester, inexpensive testers based on PC motherboards have been developed. These motherboard-based testers cost only about $10K yet can replace a quarter-million-dollar I.C. tester when testing memory modules. The memory module to be tested is inserted into a test socket on a test adapter board (daughter card) mounted on the back-side of the motherboard. See "Connector Assembly for Testing Memory Modules from the Solder-Side of a PC Motherboard with Forced Hot Air", U.S. Ser. No. 09/702,017, now U.S. Pat. No. 6,357,023.

FIG. 1 highlights testing a memory module using a horizontally-mounted motherboard. A conventional PC motherboard is mounted horizontally, but upside-down, within chassis 60. Rather than connect motherboard substrate 30 directly to chassis 60, as in a conventional PC, motherboard substrate 30 is mounted to metal plate 64 by standoffs or spacers 61. Motherboard substrate 30 is not mounted directly to chassis 60 in this embodiment, although it could be in some embodiments. Screws, bolts, or clamps (not shown) can be used to secure metal plate 64 to chassis 60.

Test adapter board 50 is mounted to well 66, while well 66 is mounted to metal plate 64. Test socket 51 is mounted to test adapter board 50, while pins 52 provide electrical connection from test socket 51 to motherboard substrate 30. The memory module 18 being tested is inserted into test socket 51. Test adaptor board 50 provides electrical connection from the module-under-test (MUT) in the SIMM/DIMM test socket 51 to the leads for the removed SIMM socket on the PC motherboard.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38. SIMM/DIMM sockets 38 (hereinafter DIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below substrate 30, while test socket 51 is mounted above substrate 30. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has adapter pins 52 inserted in holes to make electrical contact. These adaptor pins are soldered into through-holes in adaptor board 50 and in substrate 30. Adapter pins 52 are arranged to have the same arrangement and spacing as the substrate-mounting pins for DIMM sockets 38. One or more of DIMM sockets 38 has been removed from the component side of the PC motherboard, leaving the through-holes. Adapter pins 52 are then fitted through the exposed through holes for the removed SIMM socket. Rather than push the pins through from component-side 32, adapter pins 52 are pushed through from solder-side 34 to component-side 32.

Top plate 75 can be mounted to chassis 60 in a variety of ways, such as by standoffs or metal guides or brackets. Top plate 75 has an opening to allow access to test socket 51 so that a robotic arm can insert and remove memory module 18 from test socket 51. Heated air may be blown between top plate 75 and metal plate 64, past memory module 18. Cooling fan 71 is provided in chassis 60 to cool motherboard substrate 30 and its components 42, 44 and expansion cards 46.

A larger chassis with multiple openings on the top, each for holding a metal plate 64 with a horizontally-mounted motherboard and test adapter board can be used. This allows for parallel testing using several motherboards and test sockets.

FIG. 2 is an overhead diagram looking down on a multi-motherboard test station with overhead rails for an x-y-z robotic handler. See Co et al., Automated Multi-PC-Motherboard Memory-Module Test System with Robotic Handler and In-Transit Visual Inspection, U.S. Pat. No. 6,415,397. Operator 100 can sit in front of the test station, controlling operation with a touch-screen or keyboard. Trays of untested memory modules can include a barcode that is scanned in to main system interface 65 by operator 100 before the tray is put into input stacker 63. Robotic handler 80 then picks untested modules that are moved over to input tray 62 by stacker 63. The modules are first inserted into leakage tester 82. Passing modules are then moved by robotic handler 80 to the test socket on the test adaptor board on the solder-side of one of motherboard substrates 30 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Each of the motherboards is mounted horizontally and upside-down and fits into a well in the frame of the test station. The test station has a surface at about bench-top level composed of the exposed solder sides of the motherboards in the wells in the frame. Robotic handler 80 rides on rails 92, 94 mounted above the level of the motherboards, such as above the head of a seated operator 100. Operator 100 also replaces repair tray 76 and VI tray 78 with empty trays when full.

Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

FIG. 3 is a diagram of a multi-motherboard test system with horizontally-mounted motherboards. Each motherboard substrate 30 is mounted horizontally, parallel to the bench top, but has its solder-side facing up, hiding the expansion cards, cables, and components underneath the test-station frame. Each motherboard has a test adaptor board 50 mounted on the solder-side of substrate 30. Each test adaptor board has at least one test socket that can receive a memory module that is inserted by robotic handler 80.

The horizontal mounting of the motherboards limits the number of motherboards that can be fitted in the test station, since each motherboard requires an area of at least its length by its width, plus spacing between adjacent motherboards. A total of just 10 motherboards are fitted into the frame of the test station in this example.

What is desired is a multiple-motherboard robotic test system with a higher density of motherboards and test sockets. A higher-density test system that can test more memory modules by more tightly packing motherboards into the test system is desirable.

DETAILED DESCRIPTION

The present invention relates to an improvement in memory-module testers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the number of motherboards in the current test system is limited by the surface area of the motherboard. Smaller motherboards can be used to increase the number of motherboards and test adapter boards in a test system, but such size reductions in motherboard size are limited by components on the motherboard. The inventors realize that horizontal mounting of the motherboards within the test system is the limiting factor.

The inventors have discovered that the number of motherboards in a test system can be dramatically increased if the motherboards are mounted vertically, rather than horizontally. Vertical mounting of the motherboards reduces the area footprint since motherboards have larger lengths and widths than heights, even when components such as adapter cards are inserted into the motherboard.

Figure 4:
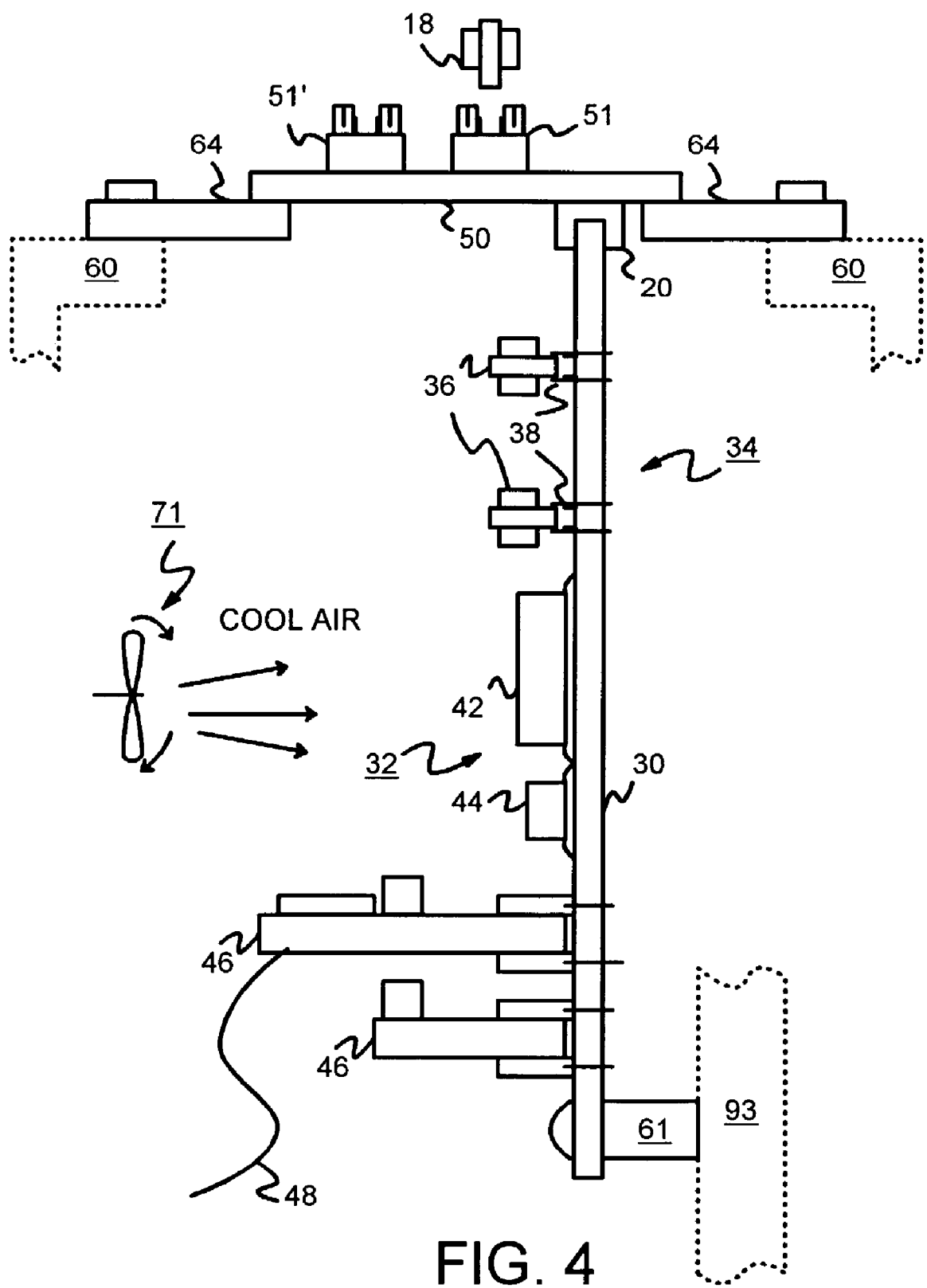
FIG. 4 shows a motherboard that is vertically mounted to a test adapter board in a test system.

FIG. 4—Vertically-Mounted Motherboard

FIG. 4 shows a motherboard that is vertically mounted to a test adapter board in a test system. A conventional PC motherboard is mounted vertically, rather than horizontally, within chassis 60. Motherboard substrate 30 is partially supported by test adaptor board 50 through edge socket 20, which allows motherboard substrate 30 to be mounted perpendicularly to test adaptor board 50 and to the horizontal bench surface of the test system. Additional support of motherboard substrate 30 can be provided by frame member 93, which can support motherboard substrate 30 by bolts through standoff or spacer 61. Additional supports (not shown) for motherboard substrate 30 could also be provided.

Test adapter board 50 is mounted to upper or metal plate 64, which forms part of the horizontal or bench-top surface of the test system. Screws, bolts, or clamps (not shown) could be used to secure metal plate 64 to chassis 60. Test socket 51 is mounted to test adapter board 50, and second test socket 51' may be used for testing two memory modules in parallel, doubling the test throughput. Memory module 18 being tested is inserted into test socket 51 or 51'.

Edge socket 20 is mounted to the bottom surface of test adaptor board 50. Edge socket 20 can be a standard socket that mates contacts along an edge of motherboard substrate 30. Edge socket 20 and test adaptor board 50 provide electrical connection from test sockets 51, 51' to motherboard substrate 30.

Motherboard substrate 30 is modified to route DRAM bus signals to edge connectors along the edge of motherboard substrate 30 that plugs into edge socket 20. DRAM bus signals to SIMM/DIMM sockets 38 on motherboard substrate 30 are extended to the edge connectors to make electrical contact to test adaptor board 50 when the edge of motherboard substrate 30 is inserted into edge socket 20.

Motherboard substrate 30 has components 42, 44 (I.C. chips, sockets, capacitors, etc.) mounted on component-side 32 of substrate 30. Memory modules 36 are SIMM or DIMM modules that fit into SIMM/DIMM sockets 38. SIMM/DIMM sockets 38 (hereinafter DIMM sockets 38) have metal pins that fit through holes in substrate 30. Expansion cards 46 are plugged into expansion sockets that are also mounted onto component-side 32 of substrate 30. Cables 48 and expansion cards 46 are bulky but do not interfere with a robotic arm inserting memory module 18 into test socket 51 since cables 48 and expansion cards 46 are mounted below test adaptor board 50, while test socket 51 is mounted on the top surface of test adaptor board 50. Cables 48 and expansion cards 46 are kept out of the way inside chassis 60.

Test adapter board 50 is a small circuit board that allows an automated handler, a person, or a robotic arm easy access to SIMM/DIMM test socket 51 that is mounted on test adaptor board 50. Test socket 51 on one surface of test adapter board 50 mates with connectors on SIMM/DIMM memory module 18, the module-under test. The other surface of adaptor board 50 has edge socket 20 to make electrical contact to motherboard substrate 30.

None of DIMM sockets 38 have to be removed from the component side of the PC motherboard, since the DRAM bus is extended to the new edge contacts to make contact when plugged into edge socket 20.

Heated air may be blown above metal plate 64, past memory module 18. Cooling fan 71 is provided in chassis 60 to cool motherboard substrate 30 and its components 42, 44 and expansion cards 46.

Figure 5:
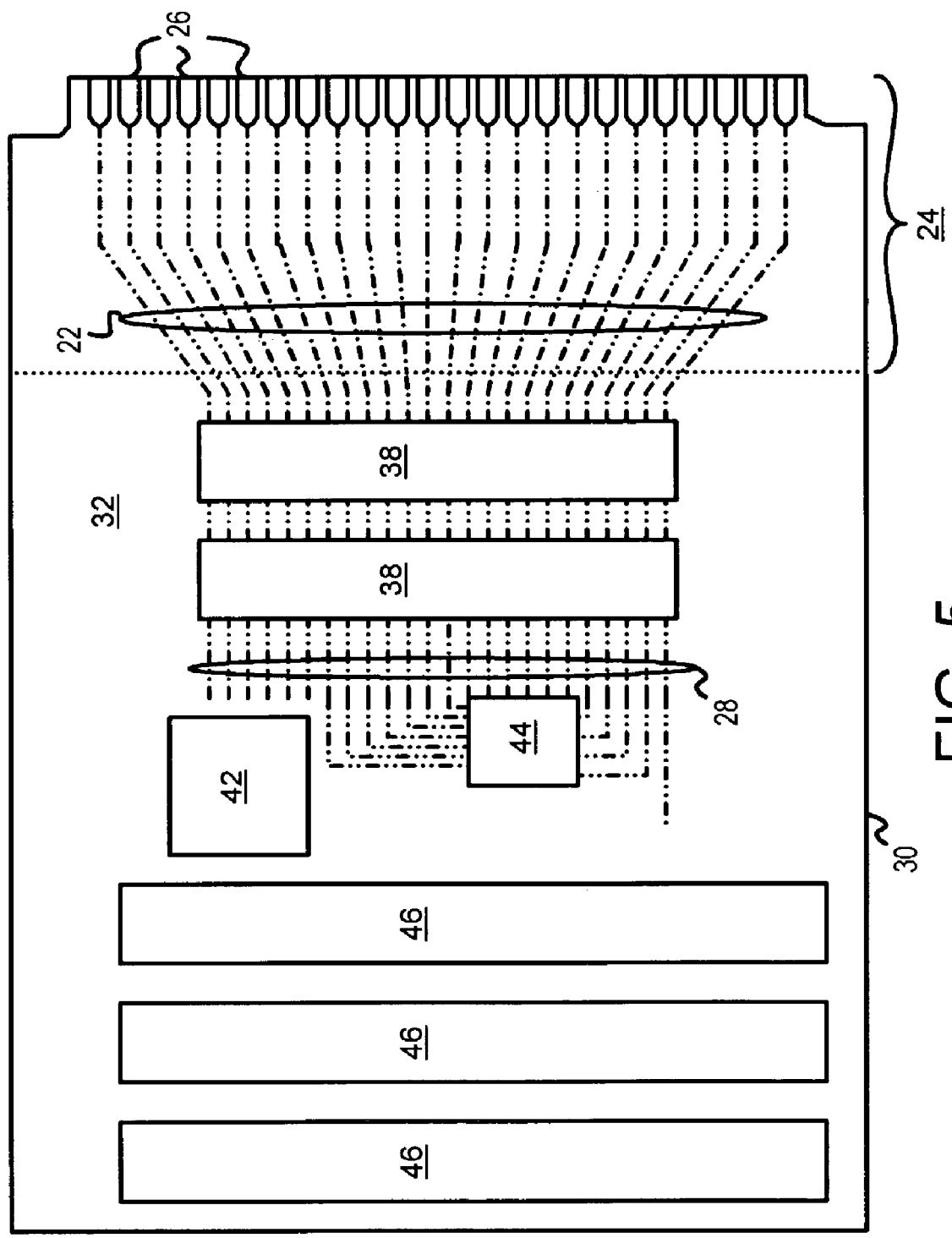
FIG. 5 shows a motherboard modified to extend DRAM bus signals to edge contacts for inserting into an edge socket on the test adaptor board.

FIG. 5 shows a motherboard modified to extend DRAM bus signals to edge contacts for inserting into an edge socket on the test adaptor board. Top surface 32 of motherboard substrate 30 is shown in an overhead view. Sockets for expansion cards 46 are driven by signals from components 42, 44 or other chips (not shown) such as a bus-bridge chip. Component 42 may be a microprocessor that drives address, data, and control signals to component 44, which contains a DRAM controller that drives DRAM bus 28. DRAM bus 28 contains multiplexed row/column address signals, data, and control signals to control and access memory modules inserted into DIMM sockets 38.

Motherboard substrate 30 is enlarged compared with a standard motherboard to include extended region 24. DRAM bus 28 is extended beyond DIMM sockets 38 into extended region 24. DRAM bus 28 includes extended traces 22 that connect to contact pads 26 along an edge of motherboard substrate 30. Contact pads 26 are metalized pads that make electrical connection to metal lines in edge socket 20 when the right edge of motherboard substrate 30 is inserted into edge socket 20 on test adaptor board 50 (FIG. 4).

Motherboard substrate 30 can be a customized motherboard that is modified from a standard PC motherboard. Contact pads 26 can be added to extended region 24 and connected to corresponding signal traces of DRAM bus 28 by routing extended traces 22. Traces may be wiring traces on any of several layers of a multi-layer circuit board for motherboard substrate 30, and may include vias between layers or other common routing techniques.

The entire right edge of motherboard substrate 30 may be inserted into edge socket 20, or a reduced portion of the right edge containing contact pads 26 may also be inserted into smaller edge socket 20. The length of the right edge inserted into edge socket 20 can be reduced by notches, cut-outs, or cut backs along the right edge.

Figure 6:
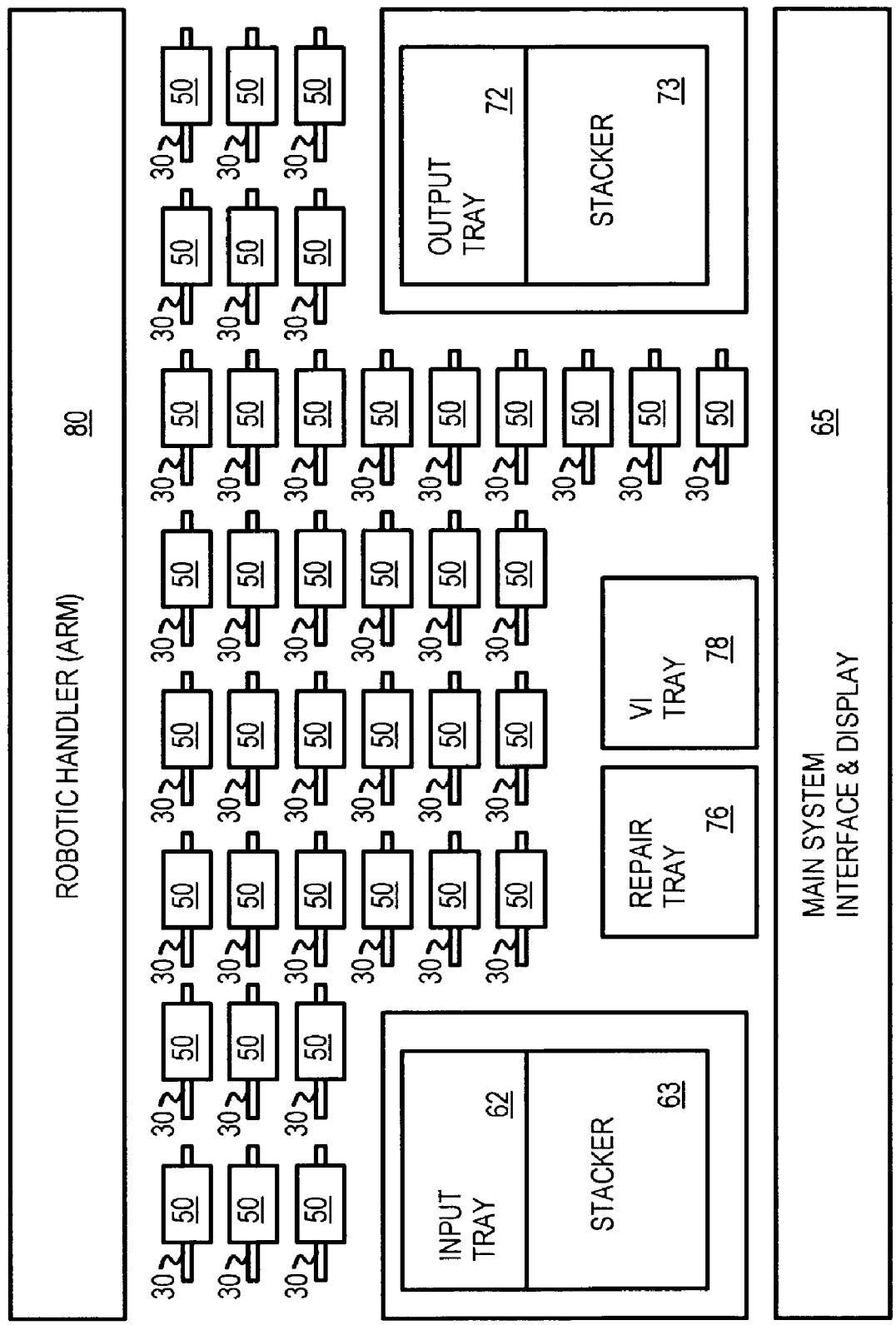
FIG. 6 shows a higher-density robotic test system that uses multiple motherboards vertically mounted to test adaptor boards.

FIG. 6 shows a higher-density robotic test system that uses multiple motherboards vertically mounted to test adaptor boards. Motherboard substrates 30 are vertically mounted and appear edge-on from this overhead view. Each motherboard substrate 30 is plugged into an edge socket on a test adaptor board 50. Test adaptor boards 50 are mounted horizontally along the bench-top surface of the test system. Each test adaptor board 50 has one or more test sockets (not shown) for receiving memory modules to be tested by the motherboard attached to the test adaptor board.

Robotic handler 80 inserts and removes memory modules from the test sockets on test adaptor boards 50 without damage to the modules or the test sockets. The frame of the test system and the edge sockets hold the motherboards vertically and below the test adaptor boards 50 at the bench-top level of the test station.

Main system interface 65 contains a host computer system with an interface to the operator such as a display and a keyboard or barcode reader. Main system interface 65 controls robotic handler 80 and commands motherboard substrates 30 to begin tests on inserted memory modules. The test results are communicated back to main system interface 65, which instructs robotic handler 80 to move the tested module from the motherboards.

Trays full of untested memory modules are loaded into stacker 63 in a stack. The tray at the top of the stack is exposed to robotic handler 80, which removes modules from the top tray of input tray 62 for testing by the motherboards. Once the top tray is emptied of modules, the top tray is pushed down to a second stack of empty trays. A new full tray from stacker 63 is slid from the top of the full stack to the top of the empty stack, allowing robotic handler 80 to continuously remove memory modules.

The empty trays from input stacker 63 are moved over to output stacker 73 by the operator. Output tray 72 likewise operates with stacker 73, pushing empty trays up one stack until exposed to robotic handler 80, which fills the empty trays with tested memory modules. Once a tray is filled, it is pushed down the full stack until the operator removes the full trays.

Once a motherboard has finished testing a module, robotic handler 80 picks the module from the test socket on its test adaptor board 50 and moves the module to a visual inspection position. Modules failing the visual test are placed in VI tray 78, while modules passing both the visual and motherboard-functional tests are placed on output tray 72. Modules that fail the motherboard functional test are placed on repair tray 76.

Figure 3:
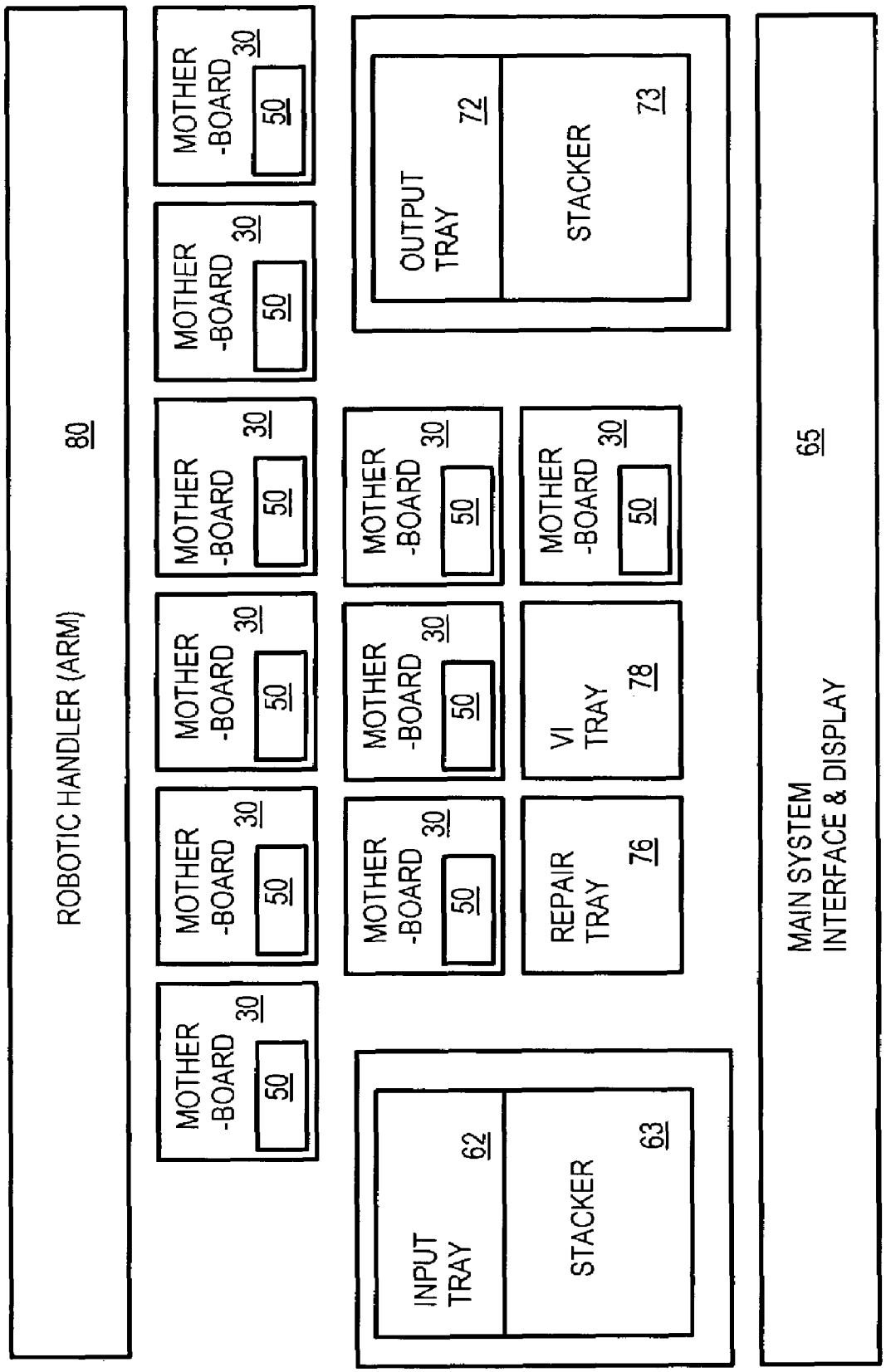
FIG. 3 is a diagram of a multi-motherboard test system with horizontally-mounted motherboards.

A much higher density of test adaptor boards 50 is achieved using the vertical mounting of motherboard substrates 30. In this example, a total of 39 test adaptor boards 50 are available, compared with just 10 test adaptor boards 50 in FIG. 3. Density of motherboards and test adaptor boards has increased by almost a factor of four.

Figure 7:
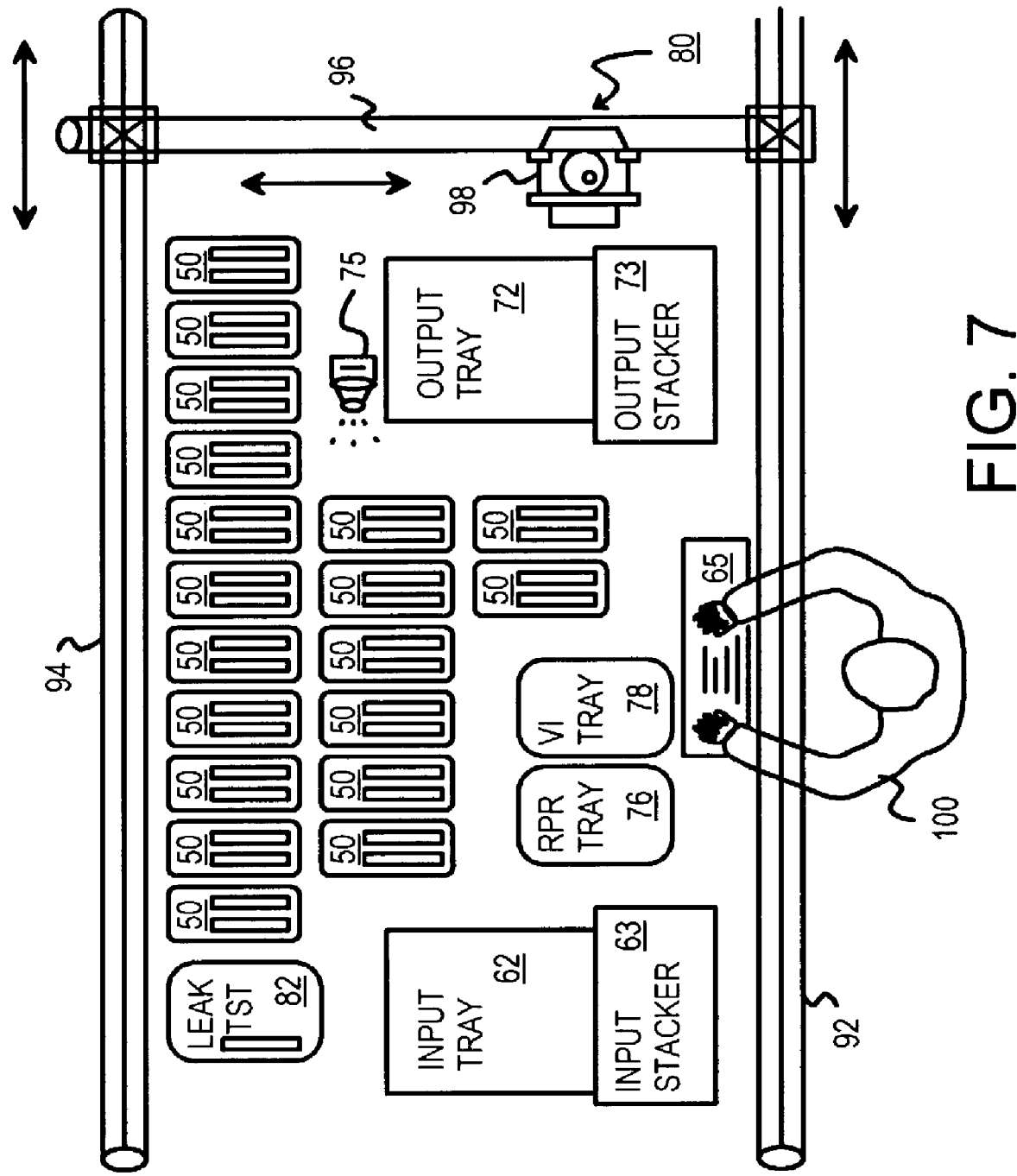
FIG. 7 is an overhead diagram looking down on a multi-motherboard test station with vertically-mounted motherboards and an x-y-z robotic handler.

FIG. 7 is an overhead diagram looking down on a multi-motherboard test station with vertically-mounted motherboards and an x-y-z robotic handler. Each of the motherboards (not shown) is mounted vertically and below a test adaptor board 50. Motherboards are hidden from the overhead view by test adaptor boards 50 that fit into wells in the bench-top-surface frame of the test station. The test station has a surface at about bench-top level composed of the test adaptor boards in the wells in the frame. Each test adaptor board 50 has two test sockets and can receive and test two memory modules in this example.

Figure 1:
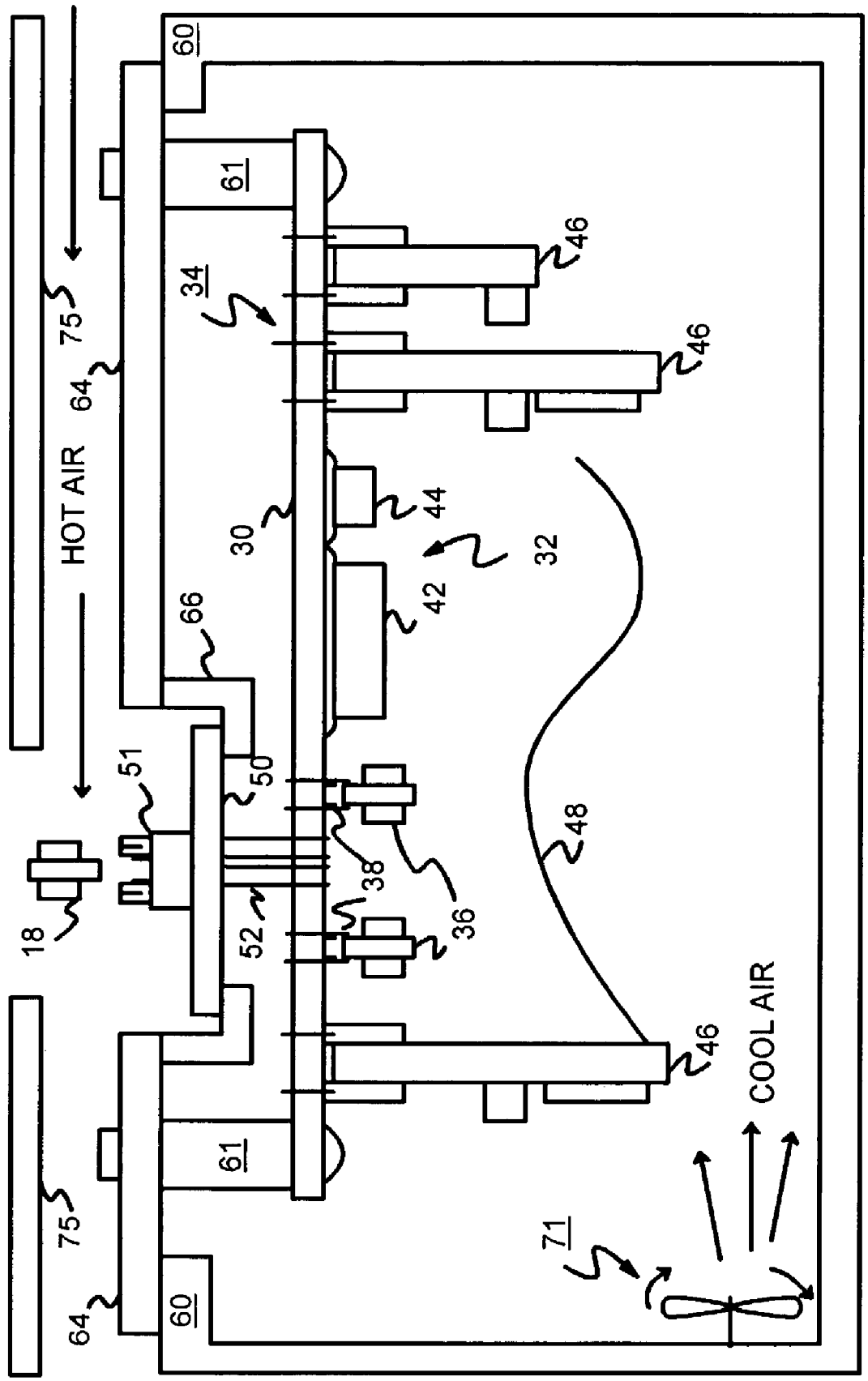
FIG. 1 highlights testing a memory module using a horizontally-mounted motherboard.
Figure 2:
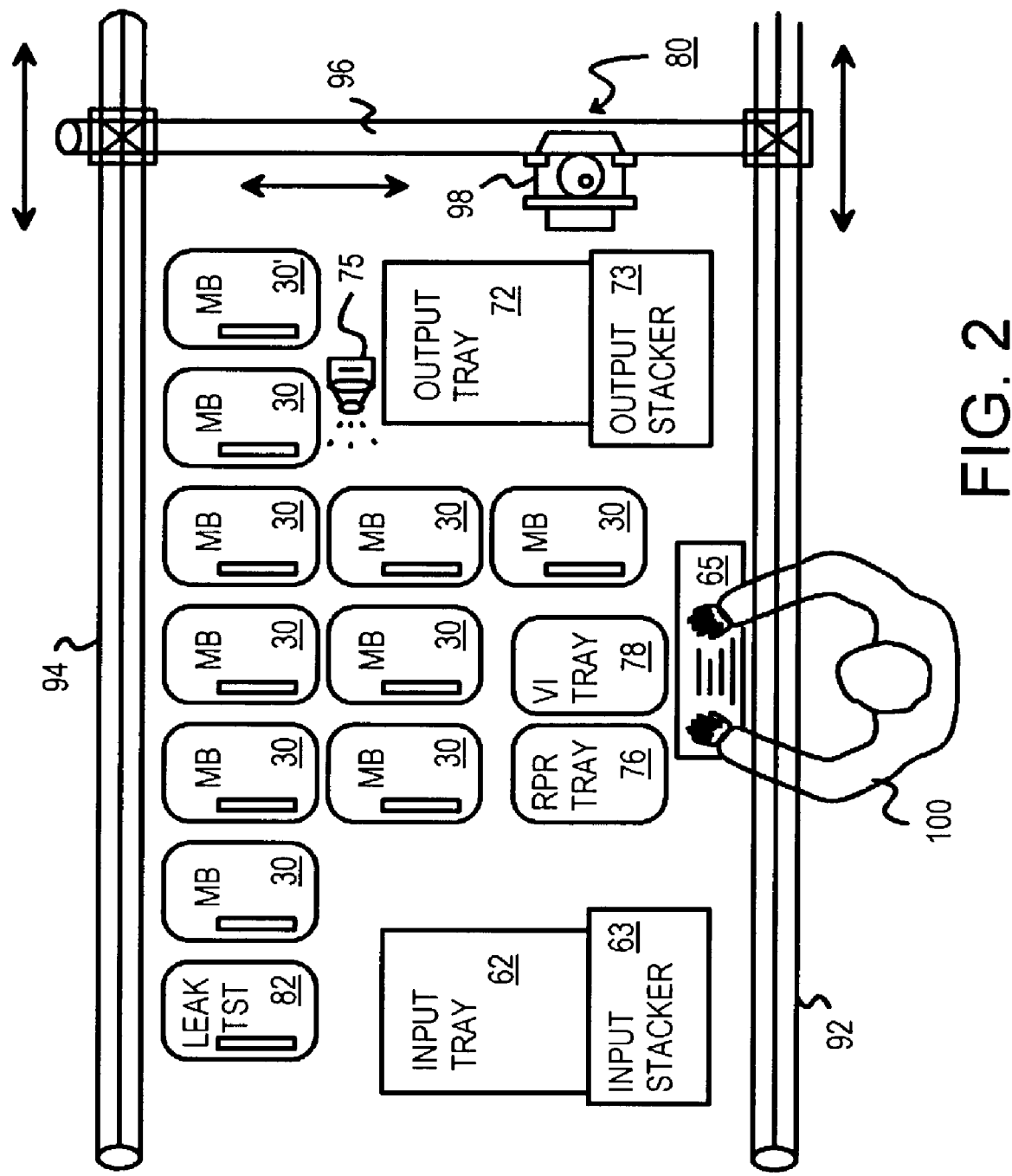
FIG. 2 is an overhead diagram looking down on a multi-motherboard test station with overhead rails for an x-y-z robotic handler.

A much higher density of test adaptor boards 50 is achieved using the vertical mounting of motherboard substrates 30. In this example, a total of 19 test adaptor boards 50 are available, compared with just 10 test adaptor boards 50 in FIG. 2. Density of motherboards and test adaptor boards has almost doubled in this example. Rotating test adaptor boards 50 could increase efficiency, allowing more test adaptor boards 50 to be mounted.

Robotic handler 80 rides on rails 92, 94 mounted above the level of the motherboards, such as above the head of a seated operator 100. Operator 100 also replaces repair tray 76 and VI tray 78 with empty trays when full. Operator 100 can sit in front of the test station, controlling operation with a touch-screen or keyboard. Trays of untested memory modules can include a barcode that is scanned in to main system interface 65 by operator 100 before the tray is put into input stacker 63.

Robotic handler 80 then picks untested modules that are moved over to input tray 62 by stacker 63. The modules are first inserted into leakage tester 82. Passing modules are then moved by robotic handler 80 to the test socket on the test adaptor board of one of vertically-mounted motherboard substrates 30 for testing.

Modules that fail the motherboard or leakage test are placed on repair tray 76 by robotic handler 80. Modules passing the motherboard test are pulled from the test socket by robotic handler 80 and moved in front of cameras 75 for visual inspection. Modules failing visual inspection are dropped into VI tray 78. Passing modules are placed on output tray 72 and full trays are moved by stacker 73 to the front of the test station where operator 100 can remove them.

Fixed rails 92, 94 in the x direction allow movable y-rail 96 to travel in the x direction. Robot arm assembly 98 then travels in the y direction along y-rail 96 until robot arm assembly 98 is directly over the desired position, such as a test socket on an adaptor board, or an input or output tray. An elevator arm on robot arm assembly 98 then moves up and down, pulling out (up) a module or inserting a module into (down) a test socket or tray. Robot arm assembly 98 can also rotate or spin the module into the desired position.

Figure 8:
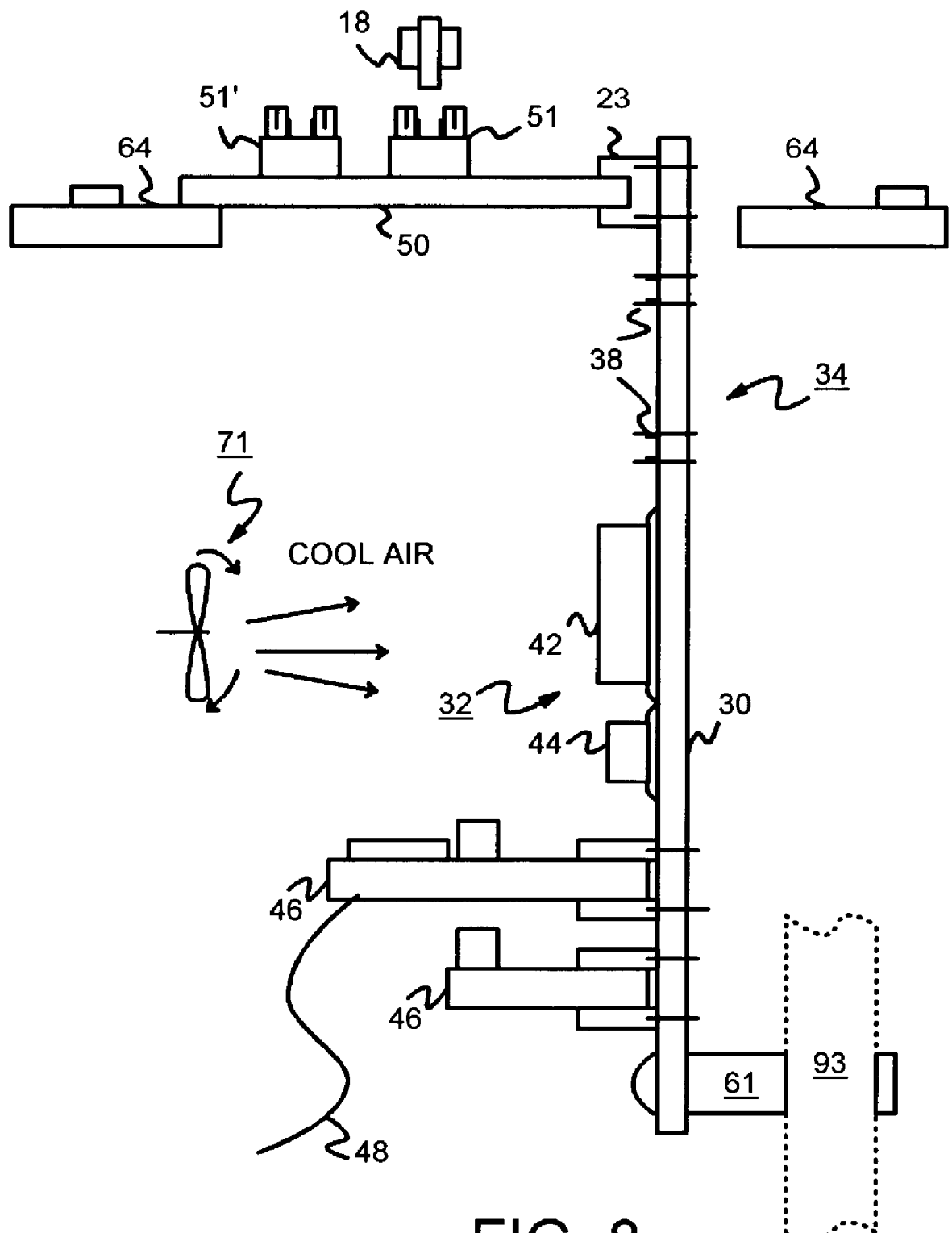
FIG. 8 is an alternate embodiment of vertical mounting of the motherboard to the test adaptor board using a socket on the motherboard.

FIG. 8 is an alternate embodiment of vertical mounting of the motherboard to the test adaptor board using a socket on the motherboard. Components are similar to that described for FIG. 4, except that motherboard substrate 30 contains card socket 23 mounted on its component-side 32. DRAM bus signals to DIMM sockets 38 are routed to card socket 23 rather than to contact pads along the edge of motherboard substrate 30.

Contact pads are formed along the edge of test adaptor board 50. These contact pads and the edge of test adaptor board 50 are inserted into card socket 23 on motherboard substrate 30. Thus the socket between test adaptor board 50 and motherboard substrate 30 is part of the motherboard rather than the test adaptor board in this alternate embodiment.

Support for motherboard substrate 30 can be provided by internal frame member 93. Test adaptor board 50 can be supported from three of its four sides, and can provide some support to motherboard substrate 30. Smaller, lighter motherboards may not need support from frame member 93, while larger motherboards may require several supporting points.

Memory modules do not need to be inserted into DIMM sockets 38 on motherboard substrate 30 in some embodiments. Instead, the motherboard can boot from the memory modules under test in test sockets 51, 51'.

Alternate Embodiments

Several other embodiments are contemplated by the inventors. For example the number of test sockets on the test adaptor boards could vary, and additional components could be added to the test adaptor boards. More than one edge socket could be used for each connection. Different mounting mechanisms and electrical connections could be substituted. The motherboard may be substantially perpendicular to the test adaptor board by being at an angle such as from 60 to 120 degrees rather than exactly 90 degrees.

Local heaters for heating the memory module being tested could be mounted on the chassis near the test adaptor boards 50 or on a metal plate that holds the motherboard substrate. A fiberglass board or other insulation that better insulates the motherboard from the elevated temperatures near the test adaptor boards 50 can also be used. A local cooling gun or compressed air rather than a local heater could be substituted to cool the test chamber and the memory module.

Many kinds of memory modules can be tested. Modules using standard DRAM or newer EDO and synchronous DRAM can be tested. The system is ideally suited for testing the highest-speed memory modules, since capacitive loading is minimized., Other memories such as RAMBUS modules, DDR modules, and PC133 synchronous modules can be tested.

Various sizes of memory in the memory module, and form factors for memory modules can be used with the invention, limited by the test adaptor board and well size. Different kinds of test adaptor boards can be substituted. The vertical-mounting of the motherboard substrates to the test adaptor boards allows a technician or operator to easily replace the test adaptor boards when necessary. Non-PC motherboards can also be used. The invention can be applied to any target system board. Multiple test sockets can be mounted on each test adapter board, or multiple test adapter boards may be mounted on a single motherboard, allowing multiple memory modules to be tested at the same time by the same motherboard acting as a tester.

A Yamaichi type connector could be used as the test socket, but a production-quality connector/socket is preferred due to the low insertion force required. A production quality connector/socket can take more insertions (greater than 100,000 times) than conventional sockets on motherboards (rated for 100 insertions). A production socket also has an ejector normally located at the 2 edges of the socket. This alleviates the ejection of modules for manual as well as robotic handling. A production socket may also contain a V-shape groove. A handler or a robotic arm can drop the module to the V-shape entry, let it settle, and then push the module from the top to the socket. The V shape entry can lower the accuracy requirement to the handler or robotic arm for insertion of the module.

A variety of technologies can be used for the robotic arm. A swinging or pivoting arm can be used, with perhaps a telescoping arm extension and a vertical servo at the end of the arm. Alternately, an x-y-z track system can be used. Many variations of automatic tray stacker or elevator systems are known and can be employed. The test program can initially pause after insertion of a new memory module to allow it to be warmed up by the hot air. Memory modules could also be pre-heated by blowing hot air onto modules waiting to be inserted and tested. The input tray could be heated to accomplish this.

One operator may be able to operate several test stations, depending on how quickly trays need to be inserted and removed. Multiple arms can be attached to robot arm assembly 98, allowing 2 or more memory modules to be picked up and moved at the same time. The test adaptor boards can be modified to have two or more test sockets, allowing two or more modules to be tested at the same time with the same motherboard. The motherboard can then report which of the 2 modules has failed to the main system interface.

A network controller card on the ISA or PCI bus that communicates with the main system interface can be adapted for other buses and is not limited to existing buses. The controller card can be replaced by a standard parallel or serial-port interface to the main system interface. FireWire, USB, or other emerging standards can be used for the interfaces. Many kinds of robotic arms and tracking systems can be employed, with different degrees of motion. Different grasping technologies can be used to hold the memory modules in the robotic arm. Multiple robotic arms that operate in tandem or independently can be used with the test station. For example, one arm can load modules into the motherboards, while a second arm unloads tested modules.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72 (b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A high-density parallel test system for testing memory modules comprising:
   a plurality of motherboards, each motherboard being a main board for a computer using memory modules as a memory;
   test adaptor boards, each coupled to a motherboard in the plurality of motherboards, the test adaptor boards each having a test socket for receiving memory modules for testing by the motherboards, each test adaptor board being a circuit board for electrically connecting a memory module inserted into the test socket to a motherboard attached to the test adaptor board, the motherboard using the memory module inserted into the test socket as a portion of the memory of the motherboard;
   a plurality of connectors, each connector for electrically connecting one of the test adaptor boards to a motherboard in the plurality of motherboards, wherein the motherboard has a substrate that is substantially perpendicular to the test adaptor board; and
   a main system interface, coupled to the plurality of motherboards, for commanding the motherboards to test memory modules inserted into a test socket and for receiving test results from the motherboards,
   whereby the memory modules inserted into the test sockets on the test adaptor boards are tested by motherboards mounted perpendicularly to the test adaptor boards.

2. The high-density parallel test system of claim 1 wherein the test adaptor boards are mounted substantially horizontally along a bench-top surface of the high-density parallel test system;
   wherein the motherboards are mounted vertically, substantially perpendicular to the bench-top-surface,
   whereby the test adaptor boards are mounted horizontally but the motherboards are mounted vertically.

3. The high-density parallel test system of claim 2 wherein the motherboards are mounted below the test adaptor boards.

4. The high-density parallel test system of claim 3 wherein a connector in the plurality of connectors comprises an edge socket mounted to a lower surface of one of the test adaptor boards, while the test sockets are mounted to an upper surface of the test adaptor boards;
   wherein an edge of the motherboard fits into the edge socket to vertically mount the motherboard below the lower surface of the test adaptor board.

5. The high-density parallel test system of claim 4 wherein each motherboard in the plurality of motherboards comprises a modified motherboard, the modified motherboard having a plurality of edge connector pads and an extension of a memory bus that connects to the plurality of edge connector pads;
   wherein the plurality of edge connector pads are for mating with contacts in the edge socket on the test adaptor board.

6. The high-density parallel test system of claim 5 wherein the motherboard has a memory module socket for receiving a memory module, the memory module socket connected to the memory bus.

7. The high-density parallel test system of claim 3 wherein a connector in the plurality of connectors comprises a card socket mounted to a surface of a motherboard in the plurality of motherboards;
   wherein an edge of the test adaptor board fits into the card socket to vertically mount the motherboard to the test adaptor board.

8. The high-density parallel test system of claim 7 wherein the card socket is mounted to a component side of the motherboard, the component side having integrated circuits mounted thereon and expansion sockets mounted thereon for expansion boards.

9. The high-density parallel test system of claim 3 further comprising:
   a robotic arm, responsive to commands from the main system interface, for inserting memory modules into the test sockets.

10. A memory-module tester comprising:
    a robotic device that moves memory modules from an input stack of untested memory modules to an output stack of tested memory modules;
    a host computer for controlling the robotic device;
    a plurality of test stations for testing memory modules that are loaded and unloaded by the robotic device, each test station comprising:
    a test adaptor board that is a circuit board;
    a test socket mounted on the test adaptor board, the test socket for receiving a memory module inserted by the robotic device;
    a motherboard for a personal computer, the motherboard executing a test program in response to commands from the host computer, the test program testing the memory module inserted into the test socket; and
    a connector between the test adaptor board and the motherboard, the connector connecting the motherboard to the test adaptor board at a substantially perpendicular angle,
    whereby memory modules are tested by the motherboard that is perpendicularly mounted to the test adaptor board.

11. The memory-module tester of claim 10 wherein the connector is mounted to the test adaptor board or the connector is mounted to the motherboard, the connector making electrical contact between the test adaptor board and the motherboard.

12. The memory-module tester of claim 10 wherein the motherboard is a modified personal computer motherboard having an extended region containing extension traces of a memory bus, the extension traces extending the memory bus for connection to the test adaptor board through the connector.

13. The memory-module tester of claim 12 wherein the extended region contains an insertable edge having contact pads that are coupled to the extension traces, the insertable edge for insertion into the connector.

14. The memory-module tester of claim 10 wherein each test adaptor board further comprises:
 a second test socket mounted on the test adaptor board, the second test socket for receiving a second memory module inserted by the robotic device,
 wherein the motherboard tests both the memory module and the second memory module, whereby two memory modules are tested by each motherboard.

15. The memory-module tester of claim 10 wherein the test adaptor boards are horizontally-mounted while the motherboards are vertically-mounted substantially below the test adaptor boards.

16. A multiple-motherboard memory tester comprising:
 main system means for controlling testing of memory modules on multiple motherboards;
 a plurality of test station means for testing memory modules, each test station means comprising:
 test socket means for receiving a memory module for testing;
 motherboard means, controlled by the main system means, for executing a test program to test a memory module inserted into the test socket means; and
 test adaptor board means, mounted perpendicularly to the motherboard means, for electrically connecting the test socket means to a memory bus means on the motherboard means;
 wherein the test adaptor board means is a circuit board that has a substrate that is substantially perpendicular to a substrate of the motherboard means;
 wherein the multiple-motherboard memory tester has a plurality of the motherboard means, each motherboard means having an attached test adaptor board means with a test socket means, each motherboard means for executing the test program on a different memory module in parallel with other motherboard means,
 whereby parallel testing of memory modules is performed by the motherboard means that is substantially perpendicular to the test adaptor board means.

17. The multiple-motherboard memory tester of claim 16 further comprising:
 robotic means, controlled by the main system means, for grasping a memory module and inserting the memory module into the test socket means, the robotic means also for grasping and removing the memory module from the test socket means after completion of the test program, and moving the memory module to an output means for storing tested memory modules when the motherboard means indicates to the main system means that the memory module has passed the test program,
 whereby the memory modules are moved by the robotic means.

18. The multiple-motherboard memory tester of claim 17 wherein each test station means further comprises:
 socket means, mounted on the test adaptor board means, for receiving an edge of the motherboard means to make electrical connection.

19. The multiple-motherboard memory tester of claim 18 wherein each motherboard means further comprises:
 extension means for extending an area of a substrate of the motherboard means;
 contact pad means, located on the extension means, for making electrical contact to the socket means when the edge of the motherboard means is inserted into the socket means.

20. The multiple-motherboard memory tester of claim 17 wherein each test station means further comprises:
 card-socket means, mounted on the motherboard means, for receiving an edge of the test adaptor board means to make electrical connection.

* * * * *